United States Patent

Abou-Kandil et al.

(10) Patent No.: US 8,859,321 B2
(45) Date of Patent: Oct. 14, 2014

(54) MIXED TEMPERATURE DEPOSITION OF THIN FILM SILICON TANDEM CELLS

(75) Inventors: Ahmed Abou-Kandil, Elmsford, NY (US); Keith E. Fogel, Hopewell Junction, NY (US); Augustin J. Hong, White Plains, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 13/017,671

(22) Filed: Jan. 31, 2011

(65) Prior Publication Data

US 2012/0192913 A1    Aug. 2, 2012

(51) Int. Cl.
*H01L 21/00* (2006.01)
*H01L 31/076* (2012.01)
*H01L 31/18* (2006.01)

(52) U.S. Cl.
CPC ............. *H01L 31/076* (2013.01); *Y02E 10/548* (2013.01); *H01L 31/18* (2013.01)
USPC .......... 438/74; 438/48; 438/57; 257/E31.003; 257/E31.13; 257/E31.041; 257/E31.042; 257/E31.043; 257/E31.049; 257/E21.001

(58) Field of Classification Search
USPC ................................................. 438/74, 48, 57
See application file for complete search history.

(56) References Cited

U.S. PATENT DOCUMENTS

| | | | | |
|---|---|---|---|---|
| 4,598,164 A * | 7/1986 | Tiedje et al. | ................... | 136/249 |
| 4,690,830 A * | 9/1987 | Dickson et al. | ................... | 438/96 |
| 4,954,182 A * | 9/1990 | Ovshinsky et al. | ........... | 136/249 |
| 5,324,364 A * | 6/1994 | Matsuda et al. | ............... | 136/249 |
| 5,403,404 A * | 4/1995 | Arya et al. | ..................... | 136/249 |
| 6,072,117 A * | 6/2000 | Matsuyama et al. | .......... | 136/256 |
| 6,288,325 B1 * | 9/2001 | Jansen et al. | ................... | 136/249 |
| 6,835,888 B2 * | 12/2004 | Sano et al. | ..................... | 136/249 |
| 7,064,263 B2 * | 6/2006 | Sano et al. | ..................... | 136/249 |
| 2008/0173348 A1 * | 7/2008 | Nasuno et al. | ................ | 136/255 |
| 2010/0071745 A1 * | 3/2010 | Lee et al. | ........................ | 136/244 |
| 2010/0313935 A1 * | 12/2010 | Coakley et al. | ............... | 136/249 |
| 2010/0313942 A1 * | 12/2010 | Coakley et al. | ............... | 136/255 |
| 2010/0313952 A1 * | 12/2010 | Coakley et al. | ............... | 136/258 |
| 2011/0114156 A1 * | 5/2011 | Coakley et al. | ............... | 136/249 |

* cited by examiner

*Primary Examiner* — Thao X Le
*Assistant Examiner* — Eric Jones
(74) *Attorney, Agent, or Firm* — Tutunjian & Bitetto, P.C.; Louis J. Percello

(57) ABSTRACT

Fabrication of a tandem photovoltaic device includes forming a bottom cell having an N-type layer, a P-type layer and a bottom intrinsic layer therebetween. A top cell is formed relative to the bottom cell. The top cell has an N-type layer, a P-type layer and a top intrinsic layer therebetween. The top intrinsic layer is formed of an undoped material deposited at a temperature that is different from the bottom intrinsic layer such that band gap energies for the top intrinsic layer and the bottom intrinsic layer are progressively lower for each cell.

17 Claims, 5 Drawing Sheets

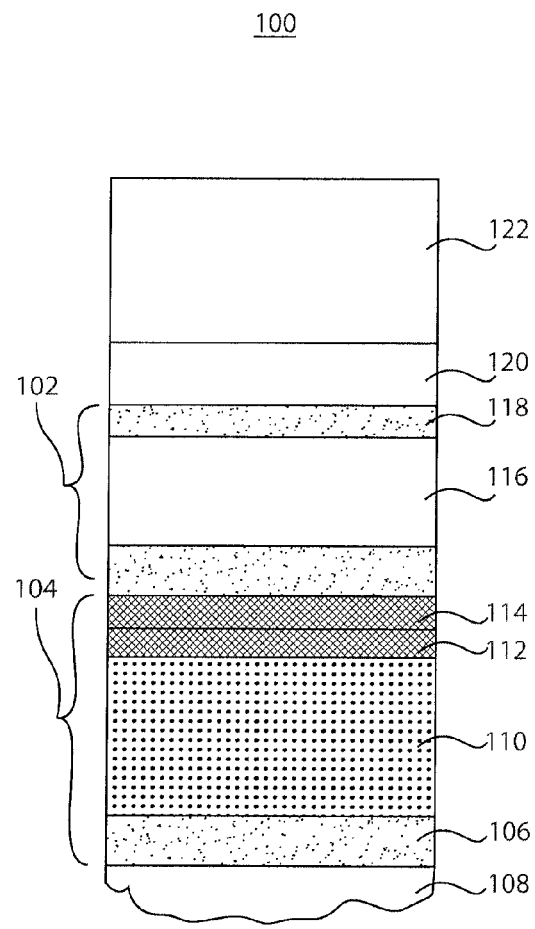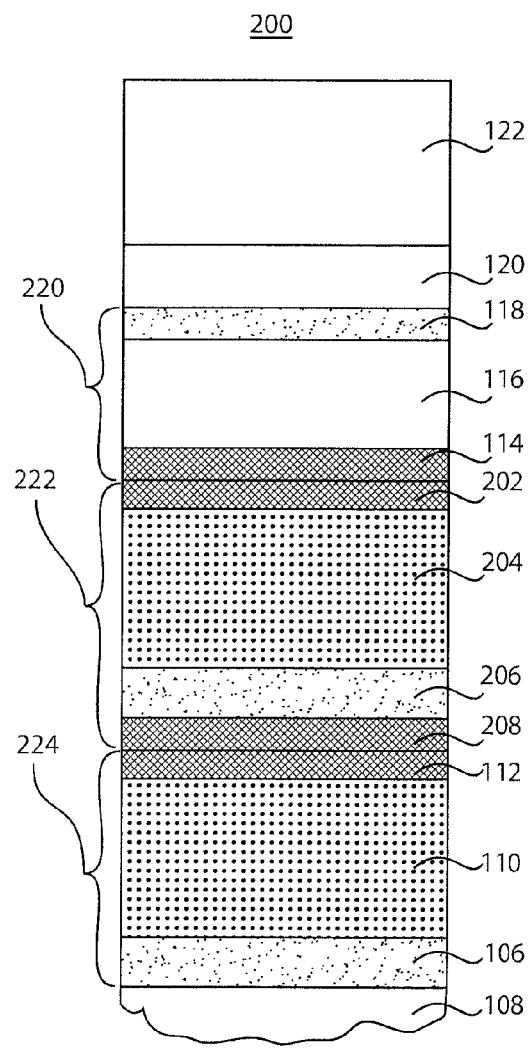
FIG. 1
FIG. 2

MIXED TEMPERATURE DEPOSITION OF THIN FILM SILICON TANDEM CELLS

BACKGROUND

1. Technical Field

The present invention relates to photovoltaic devices, and more particularly to tandem devices and methods which employ different processes between tandem cells of the devices to improve performance.

2. Description of the Related Art

Solar cells employ photovoltaic cells to generate current flow. Photons in sunlight hit a solar cell or panel and are absorbed by semiconducting materials, such as silicon. Electrons gain energy allowing them to flow through the material to produce electricity.

When a photon hits silicon, the photon may be transmitted through the silicon, the photon can reflect off the surface, or the photon can be absorbed by the silicon, if the photon energy is higher than the silicon band gap value. This generates an electron-hole pair and sometimes heat, depending on the band structure. When a photon is absorbed, its energy is given to an electron in a crystal lattice. Electrons in the valence band may be excited into the conduction band, where they are free to move within the semiconductor. The bond that the electron(s) were a part of form a hole. These holes can move through the lattice creating mobile electron-hole pairs.

A photon need only have greater energy than that of a band gap to excite an electron from the valence band into the conduction band. Since solar radiation is composed of photons with energies greater than the band gap of silicon, the higher energy photons will be absorbed by the solar cell, with some of the energy (above the band gap) being turned into heat rather than into usable electrical energy.

A solar cell may be described in terms of a fill factor (FF). FF is a ratio of the maximum power point ($P_m$) divided by open circuit voltage ($V_{oc}$) and short circuit current $$(J_{sc}): FF = \frac{P_m}{V_{oc} J_{sc}}.$$

The fill factor is directly affected by the values of a cell's series and shunt resistance. Increasing the shunt resistance ($R_{sh}$) and decreasing the series resistance (Rs) will lead to a higher fill factor, thus resulting in greater efficiency, and pushing the cells output power closer towards its theoretical maximum. The increased efficiency of photovoltaic devices is of utmost importance in the current energy environment.

SUMMARY

Fabrication of a double junction tandem photovoltaic device includes forming a bottom cell having an N-type layer, a P-type layer and a bottom intrinsic layer therebetween. A top cell is formed relative to the bottom cell. The top cell has an N-type layer, a P-type layer and a top intrinsic layer therebetween. The top intrinsic layer is formed of an undoped material deposited at a temperature that is different from the bottom intrinsic layer such that band gap energy difference between the top intrinsic layer and the bottom intrinsic layer are progressively separated from each other so that performance of this tandem device can be maximized.

A method for fabrication of a triple junction tandem photovoltaic device includes forming a bottom cell having an N-type layer, a P-type layer and a bottom intrinsic layer therebetween; forming at least one middle cell having an N-type layer, a P-type layer and a middle intrinsic layer therebetween which includes a band gap energy between that of a top intrinsic layer and the bottom intrinsic layer; and forming the top cell disposed over the at least one middle cell, the top cell having an N-type layer, a P-type layer and a top intrinsic layer therebetween. At least one intrinsic layer of the top intrinsic layer and the at least one middle layer is formed from an undoped material at a deposition temperature that is different from the bottom intrinsic layer such that a band gap energy for the at least one intrinsic layer is achieved by adjusting the deposition temperature so that the band gap energy for the at least one intrinsic layer is different (e.g., higher) than that of the bottom intrinsic layer.

A photovoltaic device includes a top cell having an N-type layer, a P-type layer and a top intrinsic layer therebetween and a bottom cell formed over the top cell and having an N-type layer, a P-type layer and a bottom intrinsic layer therebetween. The top intrinsic layer includes an amorphous SiC material formed with a lower deposition temperature than the bottom intrinsic layer to increase a band gap energy in the top intrinsic layer so that band gap energy for the top intrinsic layer is greater than that of the band gap energy of the bottom intrinsic layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a cross-sectional view of a double junction photovoltaic device in accordance with one embodiment;

FIG. 2 is a cross-sectional view of a multi junction photovoltaic device in accordance with another embodiment;

DETAILED DESCRIPTION OF PREFERRED EMBODIMENTS

Figure 3A:
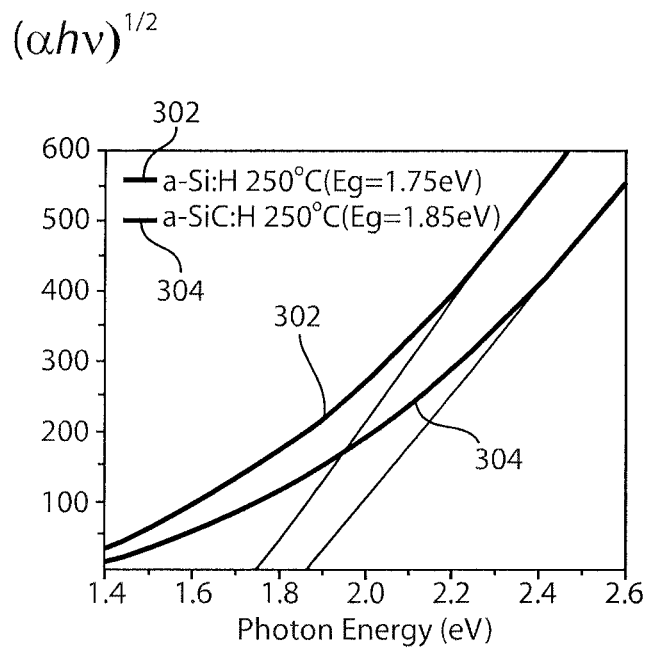
FIG. 3A is a plot of $(\alpha h\nu)^{1/2}$ versus photon energy for two different intrinsic materials (a-Si:H and a-SiC:H)

The present principles provide increased efficiency in the use of incident light for photovoltaic cells and in particular photovoltaic devices having tandem cells. Tandem cells are stacked photovoltaic cells where deeper cells collect radiation transmitted through a top layer cell or a middle cell or cells. In accordance with particularly useful embodiments, higher open circuit voltages ($V_{OC}$) and higher short circuit currents ($I_{SC}$) are achieved for tandem cells by increasing band gap splitting in intrinsic layers of the tandem cells. These improvements may be provided in a plurality of ways which will be illustratively described herein. These methods may be dependent on material selection, processing parameters, the structure of the tandem cells, etc.

In one particularly useful embodiment, tandem cell layers are deposited at different deposition temperatures to provide different band gap energies for the cells. The cells preferably include progressively higher or lower band gap energies the deeper into the device. The present principles apply different deposition temperatures at each cell to adjust the respective band gap energies. In one embodiment, a same material may be employed for intrinsic layers of multiple cells. The different cells employ a different deposition temperature to achieve the difference in band gap energy of respective intrinsic layers despite the use of the same material. Other materials and techniques may also be employed to achieve different band gap energies.

Aspects of the present invention are described below with reference to flowchart illustrations and/or block diagrams of methods and devices according to embodiments of the invention. The flowchart and block diagrams in the Figures illustrate the architecture, functionality, and operation of possible implementations, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the present invention will be described in terms of a given illustrative architecture for tandem cell photovoltaic devices; however, other architectures, structures, substrate materials and process features and steps may be varied within the scope of the present invention.

Circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an illustrative tandem photovoltaic structure 100 is illustratively depicted in accordance with one embodiment. The photovoltaic structure 100 may be employed in solar cells, light sensors or other photovoltaic applications. The embodiment depicted in FIG. 1 includes two cells 102 and 104 stacked in tandem. A first doped layer 106 may include amorphous silicon (e.g., a-Si:H), microcrystalline silicon (µc-Si:H), SiC or other suitable materials or combination thereof, such as, e.g., CIGS (CuInGaS), CdTe, poly Si or other kinds of materials for thin film solar cells. In this embodiment, the first doped layer 106 includes an N-type (n+) doping. The first layer 106 may be in contact with a substrate layer 108 or other layers which may include or be a back-reflector, if desired. The first layer 106 provides a first electrode for the bottom cell 104.

An intrinsic layer 110 includes a material compatible with layer 106 and a layer 112. The intrinsic layer 110 is undoped. In one illustrative embodiment, layer 110 may include microcrystalline silicon (µc-Si:H) or amorphous silicon germanium (a-SiGe:H) although other materials may also be employed (e.g., amorphous silicon (a-Si:H), SiC or other suitable materials, such as, e.g., CIGS (CuInGaS), CdTe, poly Si or other kinds of materials for thin film solar cells). In this embodiment, intrinsic layer 110 includes microcrystalline silicon and has a band gap, $E_g$=1.2 eV~1.4 eV.

Layer 112 has an opposite polarity relative to the layer 106 (e.g., if layer 106 is N-type then layer 112 is P-type or vice versa). In this example, layer 112 is a P-type material and layer 106 is an N-type material. In this embodiment, layer 112 may include a P-type (p+) microcrystalline silicon layer. Layer 112 is preferably thin, e.g., 1 nm to about 10 nm, more preferably around 5 nm. Layer 112 foams a second electrode of the bottom cell 104. Different combinations of material may be employed to form the photovoltaic stack, for example, CdS (n-type)/CIGS(intrinsic (i-type))/Molybdenum (p-type) on glass. Other materials may be employed as well.

Layers 106, 110 and 112 form the bottom cell 104 and layers 114, 116, and 120 form the top cell 102 to form the double junction device 100. The tandem cells 102 and 104 are configured such that light/radiation passing through the top cell 102 has a high likelihood of being absorbed in the bottom cell 104.

The layer 114 may include microcrystalline silicon (µc-Si:H), although other materials may be employed, e.g., amorphous silicon (e.g., a-Si:H) or other kinds of materials for thin film solar cells. In this embodiment, the doped layer 114 includes an N-type (n+) doping. Layer 114 is preferably thin, e.g., 1 nm to about 10 nm, more preferably around 5 nm. The layer 114 provides a first electrode for the top cell 102.

An intrinsic layer 116 contacts layer 114 and layer 118. The intrinsic layer 116 includes a material compatible with these layers. The intrinsic layer 116 is undoped. In one illustrative embodiment, layer 116 may include amorphous silicon (a-Si:

H) or amorphous silicon carbide (a-SiC:H) although other materials may also be employed (e.g., other suitable materials, such as, e.g., CIGS (CuInGaS), CdTe, poly Si or other kinds of materials for thin film solar cells). In this embodiment, intrinsic layer 116 includes amorphous silicon carbide (a-SiC:H) grown to provide a band gap ($E_g$) greater than about 1.8 eV. Increasing Carbon content increases the band gap of the top cell 102. The maximized band gap is always desirable for the top cell 102. Therefore, maximizing Carbon incorporation is desirable, but adding Carbon also degrades solar cell properties by introducing defects in the films resulting in fill factor (FF) degradation of the solar cell. Therefore, 2.0 eV is the maximum band gap achievable in this configuration in keeping with a high FF.

While the top cell 102 may employ a-Si:H, a-SiC:H is preferably employed in this embodiment for maximizing open circuit voltage of the entire tandem double junction device. In one embodiment, the SiC is grown at a lower deposition temperature as a way of increasing the band gap. By growing the SiC at a lower temperature, a bandgap increase of about 10% or more is achieved in the intrinsic layer 116.

Layer 118 has an opposite polarity relative to the layer 114 (e.g., if layer 114 is N-type then layer 116 is P-type or vice versa). In this example, layer 118 is a P-type material and layer 114 is an N-type material. In this embodiment, layer 118 may include a P-type (p+) microcrystalline silicon layer. Layer 118 is preferably thin, e.g., 1 nm to about 10 nm, more preferably around 5 nm. Layer 118 forms a second electrode of the top cell 102. Different combinations of material may be employed to form the photovoltaic stack of the bottom cell 104.

Tandem cell device 100 is fabricated to maximize $V_{OC}$. Multiple junctions are formed together so that the $V_{OC}$ of each junction is cumulatively added resulting in a high $V_{OC}$ for the multi-junction device due to the tandem cells. The $J_{SC}$ of the tandem cell device 100 is controlled by a single junction device, i.e., the device with the lowest $J_{SC}$. To increase the performance of the device 100, it is desirable that any radiation that passes through the top cell 102 is absorbed in the bottom cell 104 (or middle cells). This is achieved by providing gap energy splitting ($E_g$ splitting). For example, the top cell 102 has higher band gap materials and receives light first. The light spectra that is not absorbed at the top cell 102 enters the bottom cell 104. A larger band gap difference between two different junctions is better to prevent the light spectra from being shared between the junctions to maximize photocurrent. Gap energy splitting permits the absorption of radiation with different energies between the cells. Since the band gap of the top cell is maintained at a higher level, the lower level cells are designed to have a lower band gap. In this way, the lower cells have a higher probability of absorbing transmitted radiation, and the entire tandem cell becomes more efficient since there are fewer photon energy levels shared between the layered cells. This results in increased probability of absorbing light passing through to the bottom cell 104 hence increasing the current in the bottom cell 104, increasing $J_{SC}$.

Given the band gap of the bottom cell or middle/bottom cells, higher band gap materials of the top or upper tandem cells can result in improvement in $V_{OC}$. It is preferable that band gap splitting or a greater difference between band gaps exists between the top cell 102 (higher band gap), and the bottom cell 104 (lower band gap). This may be achieved by material selection and/or through material processing.

In one embodiment, to increase the band gap of the top cell 102 using, e.g., a-SiC:H, carbon content can be increased. Too much carbon however can degrade cell properties. A desired level of band gap can be obtained by using lower Carbon content in an intrinsic layer with lower temperature SiC growth as $E_g$ is sensitive to growth temperature. In one embodiment, the deposition temperature of the top cell 102 is reduced from 250 degrees C. to 150 degrees C. by keeping the bottom cell deposition temperature at 250 degrees C. For a p-i-n on glass structure, where the top cell is deposited earlier than a middle and a bottom cell, the bottom cell or middle cell deposition temperature cannot exceed 300 C since this would change the band gap of the top cell by losing atomic hydrogen in the a-Si:H films of the bottom cell. For an n-i-p on metal substrate configuration, the bottom/middle cell deposition temperature is not restricted with regard to top cell deposition.

Lower or bottom cells preferably may have their band gap reduced. This may be provided using material selection and/or processing parameters. In the present embodiment, intrinsic layer 110 (lower cell) includes micro-crystalline Si with a band gap of 1.2 eV while intrinsic layer 116 (top or upper cell) includes SiC with a band gap of greater than 1.8 eV.

A transparent conductive material 120 may be included. The transparent material 120 and layer 118 may together form an electrode for the top cell 102. The transparent conductive material 120 may include a transparent conductive oxide (TCO), such as, e.g., a fluorine-doped tin oxide ($SnO_2$:F, or "FTO"), doped zinc oxide (e.g.: ZnO:Al), indium tin oxide (ITO) or other suitable materials. The transparent conductive material 120 permits light to pass through to active light-absorbing materials beneath (e.g., cells 102 and 104) and pen its conduction to transport photo-generated charge carriers. Structure 100 includes a transparent substrate 122 which may include a plastic or a glass material.

The structure 100 is preferably a silicon containing thin-film cell, which includes silicon layers which may be deposited by a chemical vapor deposition (CVD) process, or a plasma-enhanced (PE-CVD)) from silane gas and hydrogen gas. Depending on the deposition parameters, amorphous silicon (a-Si or a-Si:H), and/or nanocrystalline silicon (nc-Si or nc-Si:H), also called microcrystalline silicon μc-Si:H may be formed. Other materials as described may also be employed, e.g., SiC, SiGe, etc. It should be understood that the band gap of each cell can be adjusted in a plurality of ways. In a particularly useful embodiment, the band gap is controlled by depositing the material at a different temperature for each tandem cell. This may include keeping the same materials for all junctions (cells).

Referring to FIG. 2, an illustrative tandem photovoltaic structure 200 is illustratively depicted in accordance with another embodiment. The photovoltaic structure 200 may be employed in solar cells, light sensors or other photovoltaic applications. The embodiment depicted in FIG. 2 includes three cells 220, 222 and 224 stacked in tandem. In this embodiment, cell 224 is equivalent to the bottom cell 104 in FIG. 1. Cell 224 may include the same or similar materials. The intrinsic layer 110 may include a material compatible with layer 106 and layer 112. The intrinsic layer 110 is undoped. In one illustrative embodiment, layer 110 includes microcrystalline silicon (μc-Si:H) or a-SiGe:H although other materials may also be employed (e.g., amorphous silicon (a-Si:H) or other suitable materials, such as, e.g., CIGS (CuInGaS), CdTe, poly Si, or other kinds of materials for thin film solar cells). In this embodiment, intrinsic layer 110 includes microcrystalline silicon and has a band gap $E_g$=1.2~1.3 eV.

In this embodiment, a middle cell 222 includes a doped layer 206, which may include amorphous silicon (e.g., a-Si:H), microcrystalline silicon (μc-Si:H), SiC or other suitable materials, such as, e.g., CIGS (CuInGaS), CdTe, poly Si or other kinds of materials for thin film solar cells. In this embodiment, the doped layer 206 includes an N-type (n+) doping of microcrystalline silicon (μc-Si:H). The layer 206 contacts a layer 208 which may include microcrystalline silicon (μc-Si:H), although other materials may be employed, e.g., amorphous silicon (e.g., a-Si:H) or other kinds of materials for thin film solar cells. In this embodiment, the layer 208 includes an N-type (n+) doping. Layer 208 is preferably thin, e.g., 1 nm to about 10 nm, more preferably around 5 nm. Layer 208 and layer 206 provide a first electrode for the middle cell 222.

An intrinsic layer 204 contacts layer 206 and a layer 202. The intrinsic layer 204 includes a material compatible with these layers. The intrinsic layer 204 is undoped. In one illustrative embodiment, layer 204 includes amorphous silicon germanium (a-SiGe) or although other materials may also be employed (e.g., amorphous silicon (a-Si:H), silicon carbide (a-SiC:H) or other suitable materials, such as, e.g., CIGS (CuInGaS), CdTe, poly Si, or other kinds of materials for thin film solar cells). In this embodiment, intrinsic layer 204 includes a-SiGe:H grown to provide a band gap ($E_g$=1.5~1.6 eV) greater than the band gap of the bottom cell 224 (which is about 1.2 eV if μc-Si:H is employed) and provide a band gap ($E_g$) less than the top cell 224 (which is greater than about 2 eV if a-SiC is employed).

In this embodiment, cell 222 includes a band gap energy of about 1.5~1.6 eV using a-SiGe material. The band gap energy can be varied by changing Ge content. Increasing Ge content decreases band gap. This is preferably performed during formation although the Ge content may be increased by implantation, diffusion or other techniques after the initial formation of layer 204.

Layer 202 has an opposite polarity relative to the layers 206 and 208 (e.g., if layers 206, 208 are N-type then layer 202 is P-type or vice versa). In this example, layer 202 is a P-type material and layer 208 is an N-type material. In this embodiment, layer 202 may include a P-type (p+) microcrystalline silicon layer. Layer 202 is preferably thin, e.g., 1 nm to about 10 nm, more preferably around 5 nm. Layer 202 forms a second electrode of the middle cell 222. Different combinations of materials may also be employed to form the photovoltaic stack.

In this embodiment, the top or upper cell 220 is equivalent to the top cell 102 in FIG. 1. Cell 220 may include the same or similar materials. The intrinsic layer 116 may include a material compatible with layer 114 and layer 118. The intrinsic layer 116 is undoped. In one illustrative embodiment, layer 116 includes amorphous silicon carbide or a-Si:H although other materials may also be employed (e.g., microcrystalline silicon (μc-Si:H) or other suitable materials, such as, e.g., CIGS (CuInGaS), CdTe, poly Si, a-SiGe or other kinds of materials for thin film solar cells). In this embodiment, intrinsic layer 116 includes a-SiC and has a band gap $E_g$ greater than about 1.8 eV, preferably about 2.0 eV. The a-SiC of layer 116 preferably has its C content controlled through deposition temperature as described above.

To increase the performance of the device 200, it is desirable that any radiation that passes through the top cell 220 be absorbed in the middle 222 and/or the bottom cell 224. This is achieved by providing increased gap energy splitting ($E_g$ splitting). The band gap of the top cell is maintained at a higher level, and the middle and lower level cells are designed to have a lower band gap. In this way, the lower cells have a higher probability of absorbing transmitted radiation, and the entire tandem cell becomes more efficient.

In accordance with the structure of FIG. 2, increasing Carbon content in the top cell 220 increases band gap, and increasing Ge content in the middle cell 222 decreases band gap. One aspect of the present invention is to increase the $E_g$ of the top cell by lowering deposition temperature of the top cell with minimal use of Carbon. That is, instead of using a-SiC:H with high Carbon content for high $E_g$ in the top cell 220, the band gap is preferably adjusted using the deposition temperature. To increase the band gap of the top cell 220 using, e.g., a-SiC:H, carbon content can be increased in intrinsic layer 116 as described above (using a lower temperature of formation). Middle cell 222 and bottom cell deposition temperatures may be fixed to be, e.g., about 250 degrees C.

Lower or bottom cells may preferably have their band gap reduced. This may be provided using material selection and/or processing parameters. In the present embodiment, intrinsic layer 110 (lower cell) includes micro-crystalline Si with a band gap of 1.2~1.3 eV. Intrinsic layer 204 (middle cell) includes amorphous SiGe with a band gap of 1.5~1.6 eV. The middle cell band gap may be decreased by supplying additional Ge, if needed. Intrinsic layer 116 (top or upper cell) includes a-SiC with a band gap of 1.8~2.0 eV. This was achieved by varying the deposition temperature although Carbon content. It should be understood that the band gap of each cell can be adjusted in a plurality of ways. In a particularly useful embodiment, the band gap is controlled by depositing the material of the intrinsic layers at a different temperature for each tandem cell. This may include keeping the same materials for all junctions (cells).

Referring to FIG. 3A, a plot of $(\alpha h\nu)^{1/2}$ versus photon energy for two different intrinsic materials (a-Si:H and a-SiC:H) is illustratively shown. A first curve 302 shows a-Si:H formed at 250 degrees C. ($E_g$=1.75 eV) and a second curve 304 shows a-SiC:H formed at 250 degrees C. ($E_g$=1.85 eV).

Figure 3B:
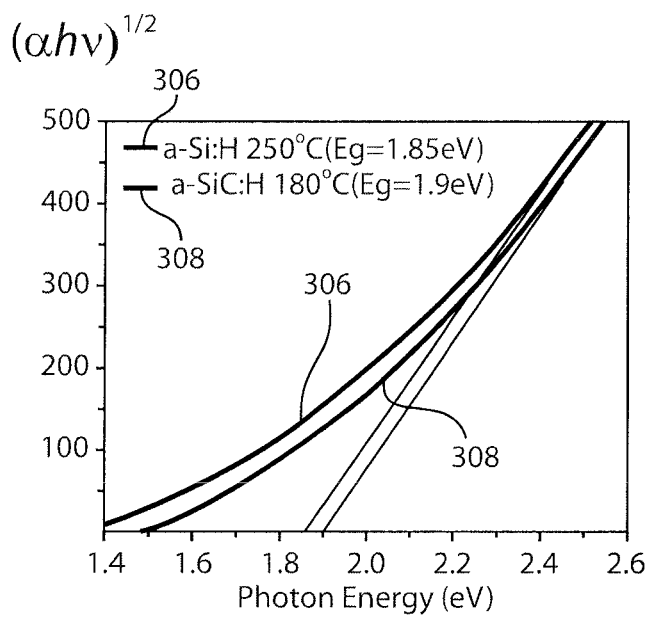
FIG. 3B is a plot of $(\alpha h\nu)^{1/2}$ versus photon energy for a same intrinsic material (a-SiC:H) deposited at different temperatures.

Referring to FIG. 3B, a plot of $(\alpha h\nu)^{1/2}$ versus photon energy for a same intrinsic material (a-SiC:H) deposited at different temperature is illustratively shown. A first curve 306 shows a-SiC:H formed at 250 degrees C. ($E_g$=1.85 eV) and a second curve 308 shows a-SiC:H formed at 180 degrees C. ($E_g$=1.90 eV).

Figure 4:
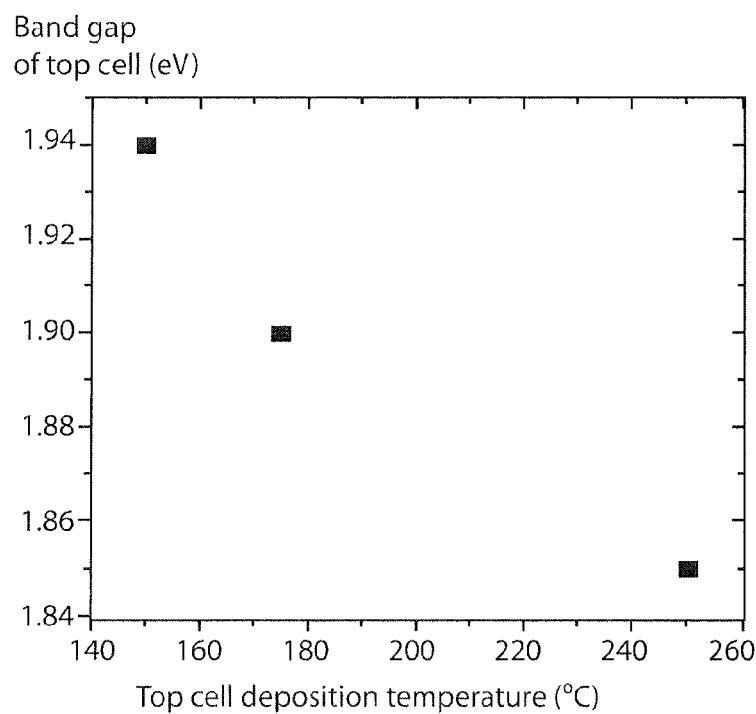
FIG. 4 is a plot of band gap (eV) versus deposition temperature for a-SiC:H.

Referring to FIG. 4, a plot of band gap (eV) versus deposition temperature for a-SiC:H is illustratively shown. For this material, the band gap decreases with formation temperature.

Figure 5:
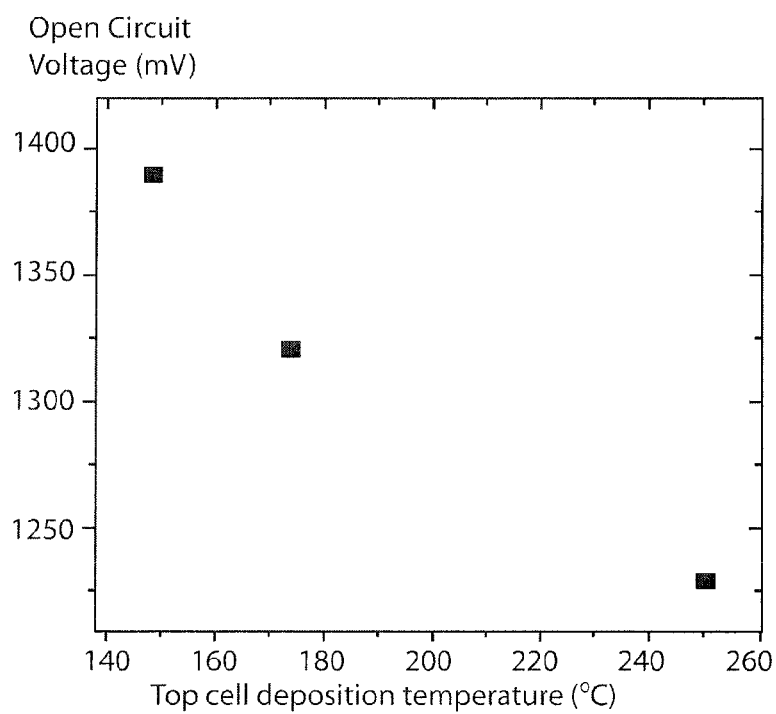
FIG. 5 is a plot of open circuit voltage (mV) versus deposition temperature of the intrinsic layer of a top cell.

Referring to FIG. 5, a plot of open circuit voltage (mV) versus deposition temperature of the intrinsic layer of a top cell is illustratively shown. The material is an amorphous Si:H. As can be seen in FIG. 5, decreasing the deposition temperature results in effectively increasing $V_{OC}$ of the tandem cell 100 of FIG. 1.

Figure 6:
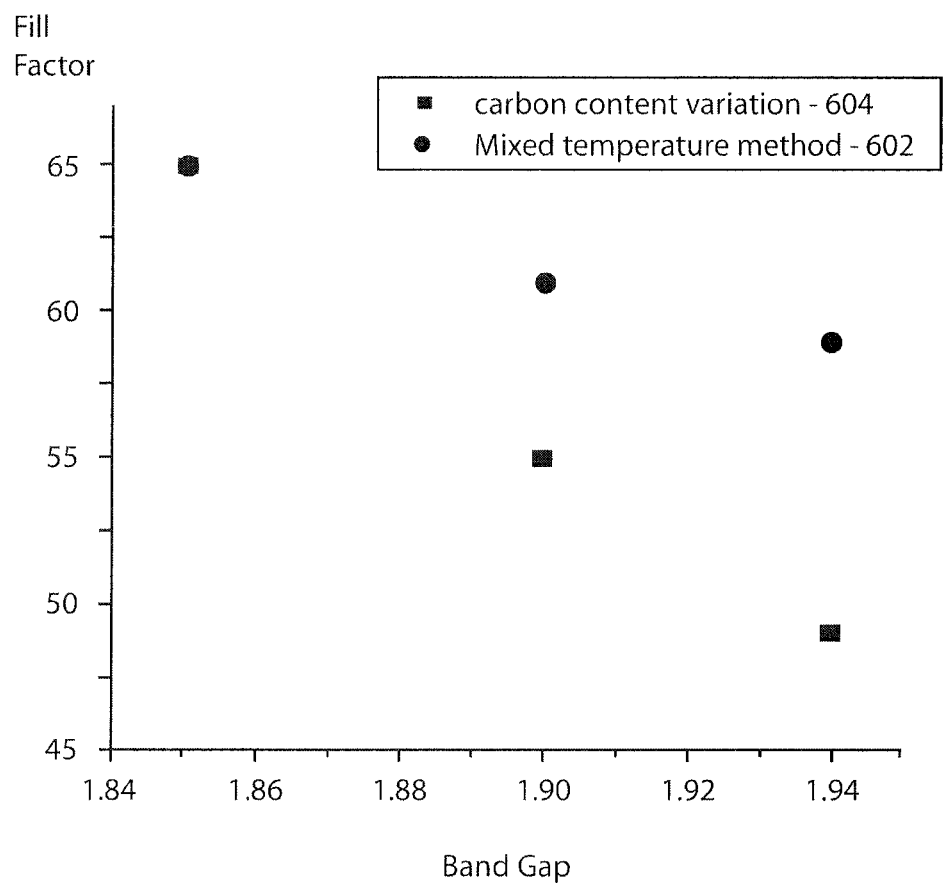
FIG. 6 is a plot of fill factor versus band gap obtained by varying temperature in constructing a tandem device that results in less degradation of the fill factor in accordance with the present principles.

Referring to FIG. 6, a plot of fill factor versus band gap is illustratively shown. It can be seen in plot 602 that the higher band gap ($E_g$) in the top cell that is obtained by varying temperature in constructing a tandem device in accordance with the present principles results in less degradation of the fill factor than for plot 604. Plot 604 shows band gap variation as a result of carbon content variation in an amorphous SiC intrinsic layer. Band gap variation by reducing top cell deposition temperature is a more effective way to obtain a high $V_{OC}$ device rather than increasing C content in the top cell.

Figure 7:
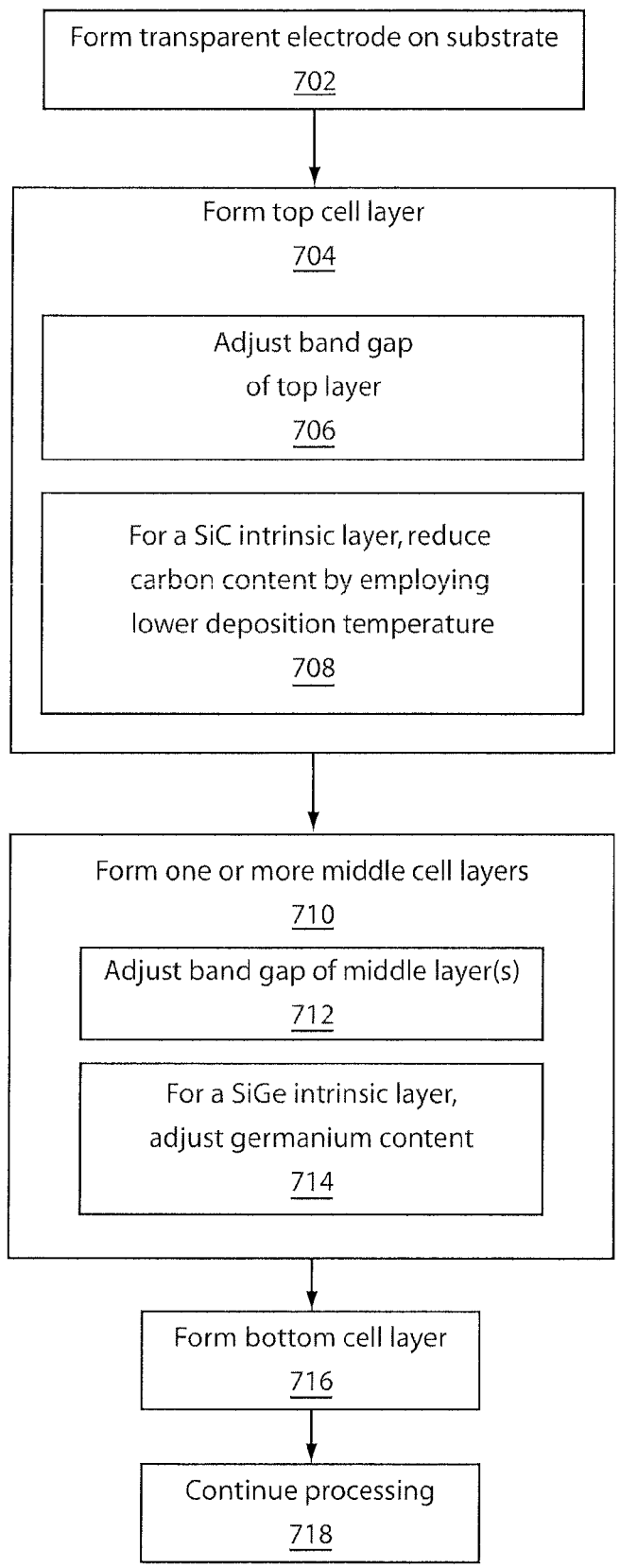
FIG. 7 is a block/flow diagram showing a method for fabrication of a tandem photovoltaic device in accordance with one embodiment.

Referring to FIG. 7, a method for fabrication of a tandem photovoltaic device is illustratively shown in accordance with one embodiment. In block 702, a transparent electrode is formed on a substrate layer. Other materials and structures may also be employed (e.g., metal layer, substrate, etc.). In block 704, a top cell is formed over the transparent electrode. The top cell has an N-type layer, a P-type layer and a top intrinsic layer therebetween. The top intrinsic layer is formed at a temperature that is different from at least a bottom intrinsic layer or a middle cell, if present, such that band gap energies for the top intrinsic layer and the bottom intrinsic layer are progressively lower (or higher) for each cell. In block 706, the top intrinsic layer may include carbon, e.g., amorphous SiC, and the carbon content may be adjusted during formation to lower a band gap energy of the top intrinsic layer. In block 708, adjusting the carbon content may include reducing a deposition temperature of the top intrinsic layer (e.g., amorphous SiC) to increase bandgap. The bottom layer may be deposited in later steps at a first temperature, e.g., between about 200-300 degrees Celsius, and the top layer may be deposited at a lower temperature, e.g., 150 degrees Celsius.

In block 710, at least one middle cell may be formed having an N-type layer, a P-type layer and a middle intrinsic layer therebetween which includes, if present, a band gap energy between that of the top intrinsic layer and the bottom intrinsic layer. In block 712, the middle intrinsic layer may include, e.g., amorphous SiGe, and germanium content in the middle intrinsic layer may be adjusted during formation or after to lower a band gap energy of the middle intrinsic layer (e.g., below that of the top intrinsic layer). In block 714, the germanium content is adjusted, e.g., by introducing Ge.

In block 716, a bottom cell having an N-type layer, a P-type layer and a bottom intrinsic layer therebetween is formed. The bottom intrinsic layer may include, e.g., a microcrystalline Si or other low band gap material. In block 718, processing continues to fabricate the photovoltaic device. In one embodiment, blocks 704, 710, and 716 may be performed by employing a different deposition temperature for each cell to provide or adjust a different band gap for each cell. This may include keeping the same materials for all junctions of the device. Note that the band gap energies may be made to increase or decrease with cell depth depending on the design.

Having described preferred embodiments for mixed temperature deposition of thin film silicon tandem cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabrication of a tandem photovoltaic device, comprising:
    forming a bottom cell having an N-type layer, a P-type layer and a bottom intrinsic layer therebetween; and
    forming a top cell relative to the bottom cell, the top cell having an N-type layer, a P-type layer and a top intrinsic layer therebetween;
    wherein the top intrinsic layer is formed from an undoped material at a first deposition temperature and the bottom intrinsic layer is formed at a second deposition temperature that is different from the first deposition temperature such that a different band gap energy is achieved for each layer by adjusting the deposition temperature so that the band gap energy for the top intrinsic layer is different than that of the bottom intrinsic layer;
    wherein the band gap energies are controlled by adjusting only the deposition temperature, and the band gap energy for the bottom intrinsic layer is lower than the band gap energy for the top intrinsic layer; and
    wherein the top intrinsic layer is deposited at a first temperature and the bottom intrinsic layer is deposited at a lower temperature.

2. The method as recited in claim 1, wherein the top intrinsic layer includes one of amorphous SiC and amorphous Si.

3. The method as recited in claim 2, further comprising adjusting a carbon content of the top cell intrinsic layer to further adjust the band gap energy.

4. The method as recited in claim 1, wherein the bottom intrinsic layer includes at least one of microcrystalline Si and amorphous SiGe.

5. The method as recited in claim 1, further comprising:
    forming at least one middle cell having an N-type layer, a P-type layer and a middle intrinsic layer therebetween which includes a band gap energy between that of the top intrinsic layer and the bottom intrinsic layer.

6. The method as recited in claim 5, wherein the middle intrinsic layer includes amorphous SiGe and further comprising adjusting germanium content of the middle intrinsic layer to adjust the band gap energy.

7. The method as recited in claim 1, wherein the first temperature is between about 200-300 degrees Celsius.

8. The method as recited in claim 1, wherein the lower temperature is less than about 200 degrees Celsius.

9. The method as recited in claim 1, wherein the top intrinsic layer and the bottom intrinsic layer include a same material with different band gap energies.

10. A method for fabrication of a tandem photovoltaic device, comprising:
    forming a bottom cell having an N-type layer, a P-type layer and a bottom intrinsic layer therebetween;
    forming at least one middle cell having an N-type layer, a P-type layer and a middle intrinsic layer therebetween which includes a band gap energy between that of a top intrinsic layer and the bottom intrinsic layer; and
    forming a top cell disposed over the at least one middle cell, the top cell having an N-type layer, a P-type layer and a top intrinsic layer therebetween;
    wherein at least the intrinsic layer of the top intrinsic layer is formed from an undoped material at a first deposition temperature, the at least one middle intrinsic layer is formed from an undoped material at a second deposition temperature that is different from the first deposition temperature, and the bottom intrinsic layer is formed at a third deposition temperature that is different from the first and second deposition temperatures such that a different band gap energy is achieved for each layer by adjusting the deposition temperature so that the band gap energy for at least the top intrinsic layer is different than that of the bottom intrinsic layer;
    wherein the band gap energies are controlled by adjusting only the deposition temperature, and the band gap energy for the bottom intrinsic layer is lower than the band gap energies of the top and middle layers; and
    wherein the top intrinsic layer is deposited at a first temperature and the bottom intrinsic layer is deposited at a lower temperature.

11. The method as recited in claim 10, wherein the at least one intrinsic layer includes amorphous SiC.

12. The method as recited in claim 11, further comprising adjusting a carbon content of the at least one intrinsic layer to further adjust the band gap energy.

13. The method as recited in claim 11, wherein the bottom intrinsic layer includes microcrystalline Si or amorphous SiGe.

14. The method as recited in claim 11, wherein the at least one middle intrinsic layer includes amorphous SiGe and further comprising adjusting germanium content of the at least one middle intrinsic layer to adjust the band gap energy.

15. The method as recited in claim 10, wherein the first temperature is between about 200-300 degrees Celsius.

16. The method as recited in claim 10, wherein the lower temperature is less than about 200 degrees Celsius.

17. The method as recited in claim 10, wherein the top intrinsic layer and the bottom intrinsic layer include a same material with different band gap energies.

* * * * *